United States Patent
Munday et al.

[11] Patent Number: 5,282,108
[45] Date of Patent: Jan. 25, 1994

[54] SURGE PROTECTOR FOR A WATTHOUR METER

[75] Inventors: Mark L. Munday; Rodney C. Hemminger, both of Raleigh, N.C.

[73] Assignee: ABB Powre T&D Company, Inc., Blue Bell, Pa.

[21] Appl. No.: 771,133

[22] Filed: Oct. 3, 1991

[51] Int. Cl.$^5$ .............................. H02H 9/04
[52] U.S. Cl. ................... 361/117; 361/129; 361/661
[58] Field of Search ............... 361/117, 118, 129, 366

[56] References Cited

U.S. PATENT DOCUMENTS

| | | | |
|---|---|---|---|
| 1,865,273 | 6/1932 | Palueff. | |
| 2,272,991 | 2/1942 | Hanna | 175/294 |
| 2,889,494 | 6/1959 | Schmidt et al. | 317/108 |
| 2,922,953 | 1/1960 | Palmer | 324/110 |
| 3,294,892 | 12/1966 | Curtis | 174/2 |
| 3,308,311 | 3/1967 | Swanson | 307/93 |
| 3,735,259 | 5/1973 | Palmer | 324/110 |
| 4,023,071 | 5/1977 | Fussell | 361/118 |
| 4,072,998 | 2/1978 | Schei | 361/117 |
| 4,092,592 | 5/1978 | Milkovic | 324/142 |
| 4,107,567 | 8/1978 | Cunningham et al. | 361/117 |
| 4,494,163 | 1/1985 | Yelland et al. | 361/56 |
| 4,862,074 | 8/1989 | Weikel | 324/107 |
| 4,881,147 | 11/1989 | Schaff | 361/118 |
| 4,896,106 | 1/1990 | Voisine et al. | 324/142 |
| 4,901,187 | 2/1990 | Allina | 361/117 |
| 5,023,747 | 6/1991 | Lindsay | 361/117 |

*Primary Examiner*—Todd Deboer
*Attorney, Agent, or Firm*—Woodcock Washburn Kurtz Mackiewicz & Norris

[57] ABSTRACT

A surge protector is provided for a multi-phase watthour meter. The surge protector allows all three phases to be protected using a single resistive block and ground strap. Separate first electrodes are connected to each phase of the circuit and each electrode is disposed adjacent one end of a different hole formed in the meter base. A second electrode is disposed at the opposite end of the holes and forms a tip at each hole, thereby forming separate spark gaps with each of the first electrodes. A resistive block mounted on the outboard side of the meter base is in surface contact with the second electrode and a single ground strap is in contact with the resistive block so as to ground the meter to its socket when arcing occurs in the spark gaps.

24 Claims, 4 Drawing Sheets

SURGE PROTECTOR FOR A WATTHOUR METER

FIELD OF THE INVENTION

The current invention concerns a surge protector for a watthour meter. More specifically, the current invention concerns a surge protector which protects all three phases of a three phase watthour using only a single ground connection and resistive block.

BACKGROUND OF THE INVENTION

There is shown in FIG. 1 an example of a watthour meter 1 according to the prior art. Although such meters come in various styles, they are generally comprised of a meter body 32 which mates with a socket 29 which may be attached to a conventional meter box (not shown). The meter body 32 has a base portion 2 to which a cover 41 is attached using lugs 40, shown in FIG. 2. The cover encloses a metering element for sensing the power consumed in a load circuit. Traditionally, the metering element was a mechanical register having a number of dials for indicating the power consumed. More recently, electronic meters have been developed in which the metering element is an electronic register 34 which, using techniques well known in the art, electronically performs the watthour accumulating function of a traditional mechanical register, as well as other specialized function, such time of day use and peak demand.

As shown in FIG. 1, the socket 29 is connected to ground via conductor 33. In addition, the socket 29 has two openings 31 through which the incoming and outgoing conductors of a three phase load circuit (not shown) are fed. Each phase of the load circuit is connected to one of three pairs of jaws 30 formed in the socket 29. A additional jaw 30 is connected to the ground wire of the load circuit. The meter body 32 has three pairs of blades 3 extending from the outboard side 38 of the meter base 2, each of which connects with one of the jaws 30 in the socket 29. Referring to FIG. 2, in this example, blade pairs $3^1$, $3^2$, and $3^3$ are connected via the jaws 30 to the first, second and third phases of the load circuit. Blade $3^4$ is connected via a jaw 30 to the ground wire of the load circuit.

As shown in FIG. 1, a conductor 43 connects each blade 3 to the other blade in the pair so that the circuit is not interrupted, thereby allowing the current flowing in the load circuit to pass through the meter 1. A current transducer 35 and a voltage transducer 42 are provided for each of the blade pairs $3^1$, $3^2$ and $3^3$ shown in FIG. 2. The current and voltage transducers 35 and 42, respectively, are connected to the metering element and step down the current and voltage in the load circuit to values suitable for metering. As shown in FIG. 2, a vent 12 is formed in the meter base.

In order to protect the meter from transient surges in either the utility service or user circuits connected to the meter, surge protectors, sometimes referred to as "lightening arrestors," are conventionally provided. As shown in FIGS. 2-4, according to the prior art, a three phase meter such as that shown in FIG. 1 is provided with three surge protectors, one for each phase. Each surge protector is comprised of an electrode 6, conductor 5, resistive block 8, ground strap 7 and spark gap 14. The electrodes 6 are connected by conductors 5 to one of the voltage input blades 3 in each blade pair in this example. A post 9 protruding from the meter base 2 secures each electrode 6 to the inboard side 36—that is, the side enclosed by the cover 41—of the meter base. As shown in FIG. 4, each resistive block 8 is disposed in a hole 15 formed in the meter base. A dimple 13 formed in the end of the electrode 6 presses the electrode against the resistive block 8. A hole 10 extends from the bottom of hole 15 and a ground strap 7 lies over the hole 10. Posts 9 secure the ground straps 7 to the outboard side 38 of the meter base 2. The end 44 of the ground strap 7 extends from the outboard side 38 so that it is spring loaded against the socket 29 when the meter body 32 is attached thereto. A dimple 13 formed in the ground strap 7 forms a spark gap 14 between it and the resistive block 8.

A voltage potential is created across the spark gap 14. During normal operation this potential is too small to cause arcing. However, a transient surge in any phase will increase the voltage developed across the spark gap 14 of the surge protector connected to that phase. If the voltage potential becomes great enough, the air within the spark gap 14 will ionize, thereby creating an arc across the gap which diverts the surge to ground via the ground strap 7, socket 29 and conductor 33. Since ionization creates gases in the spark gap 14 which are highly conductive, the resistive block 8 is placed in series between the electrode 6 and ground strap 7 to prevent the arcing from causing excessive current to flow and to ensure that this current flow extinguishes at the zero crossing of that current.

Although the surge protector arrangement according to the prior art, as described above, works well for its intended purpose, it requires a large number of components for a three phase meter. Specifically, the resistive blocks 8 and ground straps 7 must be duplicated for each phase. Moreover, since the paint on the socket 29 must be manually scrapped away in the vicinity of the ground strap 7 to ensure good electrical contact, the labor required to install a meter employing prior art surge protectors is significantly increased. In addition, since the resistive block 8 is mounted on the inboard side 36 of the meter base 2, the meter cover 41 must be removed to replace the resistive block. This increases the labor associated with maintaining the meter.

Accordingly, it would be desirable to provide a surge protector arrangement for a multi-phase watthour meter which did not require the multiplicity of components necessary under the prior art approach and which allowed the resistive block to be replaced without removing the meter cover.

SUMMARY OF THE INVENTION

It is the object of the current invention to provide a single surge protector for a multi-phase electronic apparatus, such as a watthour meter, which is capable of protecting the meter from a surge in any phase of the circuit to which the apparatus is connected.

It is a further object of the current invention to minimize the number of parts, the cost and the installation labor of the apparatus.

It is another object of the current invention to provide the apparatus with a plurality of external spark gaps for venting ionized gases and to provide spark gap isolation for preventing such gases from igniting an adjacent gap, as well as isolation between the electrodes of the spark gap to prevent arcing between electrodes.

It is yet another object of the current invention to provide a magnetic field tending to repulse the ionized gases out of the spark gaps.

It is yet another object of the current invention to provide a surge protector having a resistive block capable of replacement without removing the cover of the apparatus.

These and other objects are accomplished in a watthour meter having a socket in electrical contact with ground and a meter body. The socket has first, second and third connectors for connecting to each of three phases of an electrical load circuit. The meter body has (i) a metering element for measuring the power in the load circuit, (ii) first, second and third conductors for connecting the first, second and third phases to the metering element, (iii) a surge protector having means for protecting the metering element from transient surges in each of the phases connected thereto by the conductors, and (iv) a base portion. The surge protecting means includes (i) only one strap for making grounding contact with the socket, (ii) first, second and third electrodes in electrical contact with the first, second and third conductors, (iii) means for creating an electrical path between each of the first, second and third electrodes and the grounding strap in response to a surge in any of the first, second and third phases, respectively.

In one embodiment of the invention, the electrical path creating means includes (i) a fourth electrode, (ii) first, second and third spark gaps for the first, second and third phases, respectively, formed between the first and second and third electrodes, respectively, and the fourth electrode, and (iii) only one resistive block, in surface contact with the grounding strap. In this embodiment, the body portion of the meter forms first, second and third cavities that surround the first, second and third electrodes, respectively, to prevent sparking therebetween. The meter body also forms first and second walls between the first and second and between the second and third spark gaps, respectively, to prevent the communication of gases among the spark gaps.

DESCRIPTION OF THE PREFERRED EMBODIMENT

Figure 1:
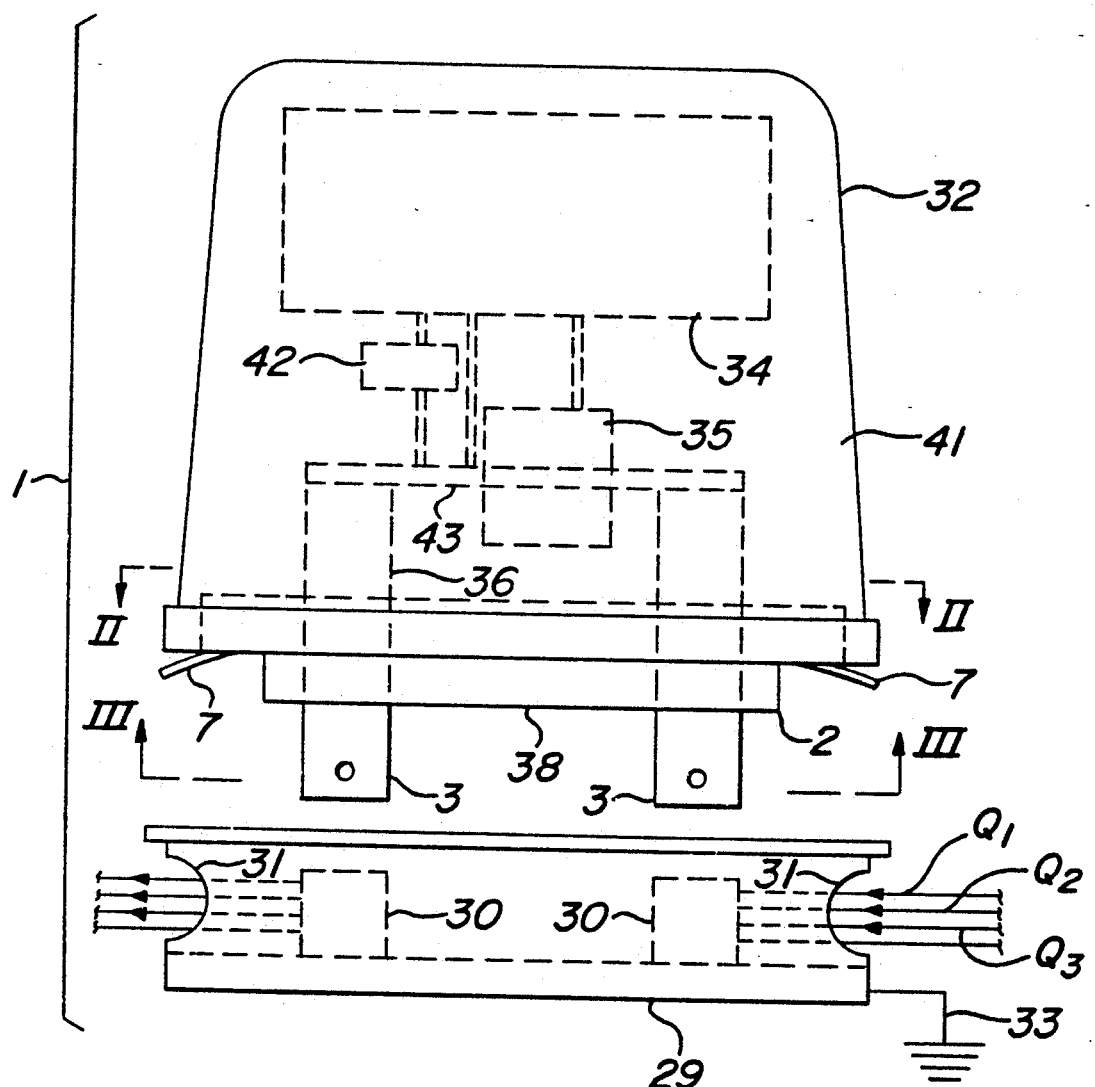
FIG. 1 is an elevation, partially schematic, of a watthour meter according to the prior art.
Figure 2:
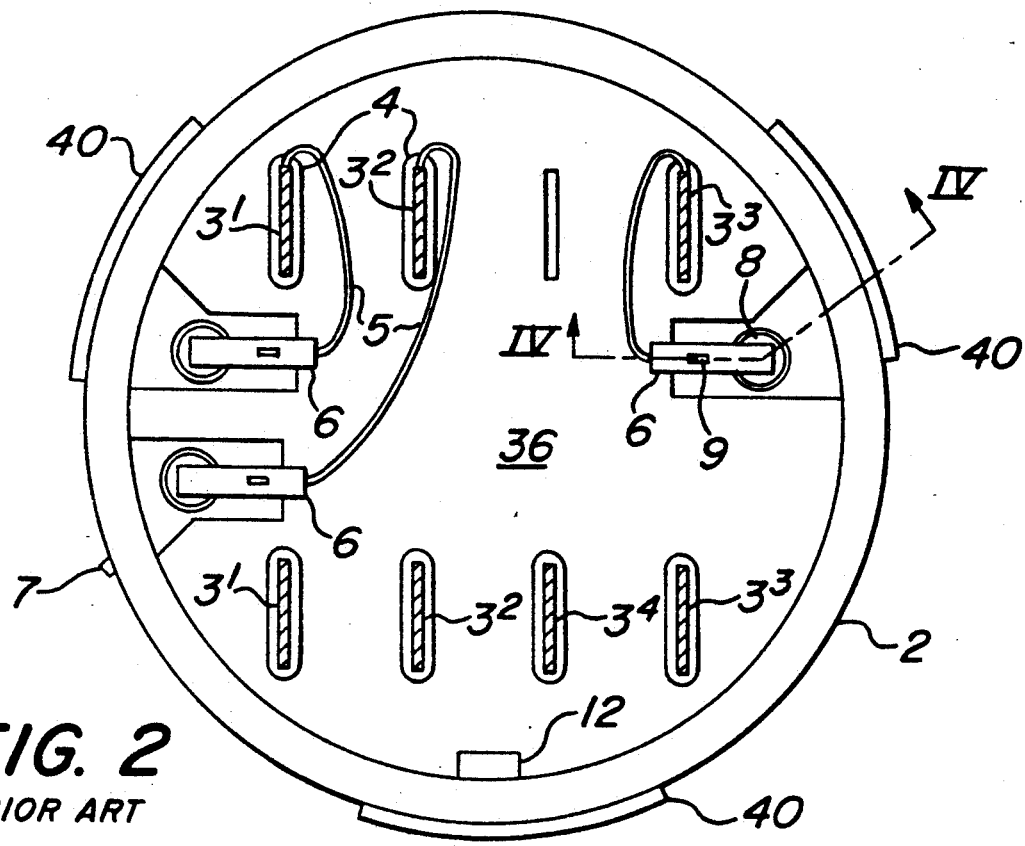
FIGS. 2 and 3 are cross-sections through lines II—II and III—III, respectively, shown in FIG. 1, showing the inboard and outboard sides, respectively, of the base portion of the meter shown in FIG. 1.
Figure 3:
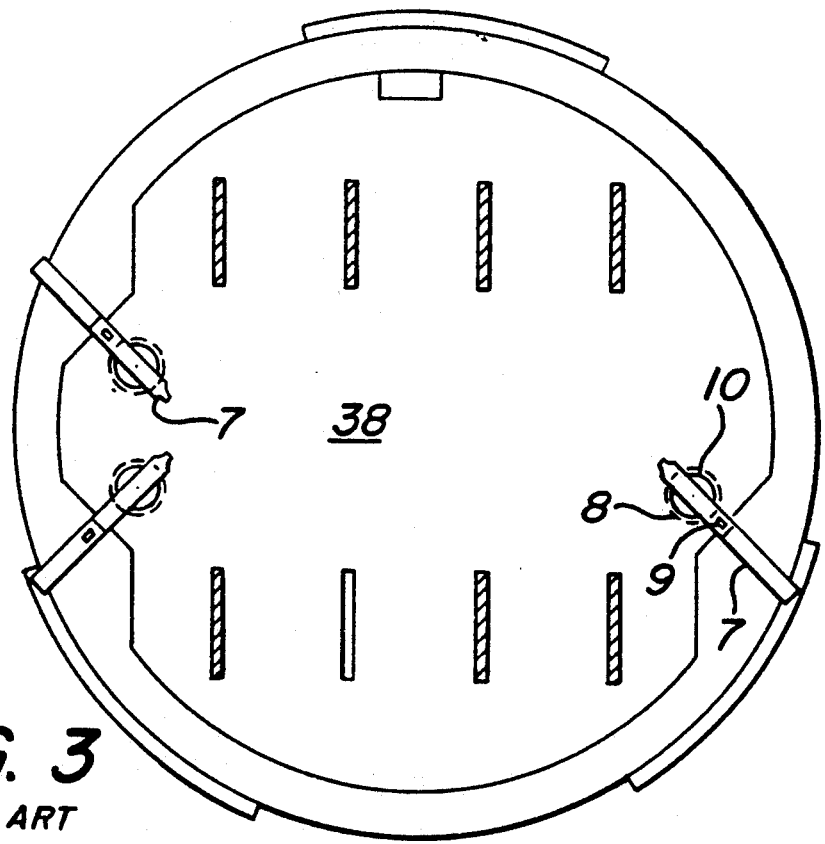
Figure 4:
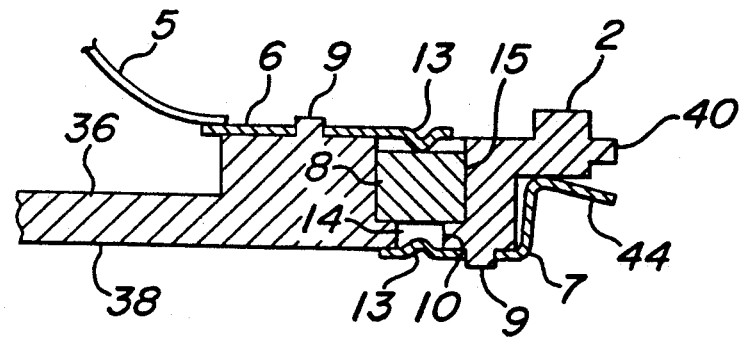
FIG. 4 is a cross-section through line IV—IV shown in FIG. 2.
Figure 5:
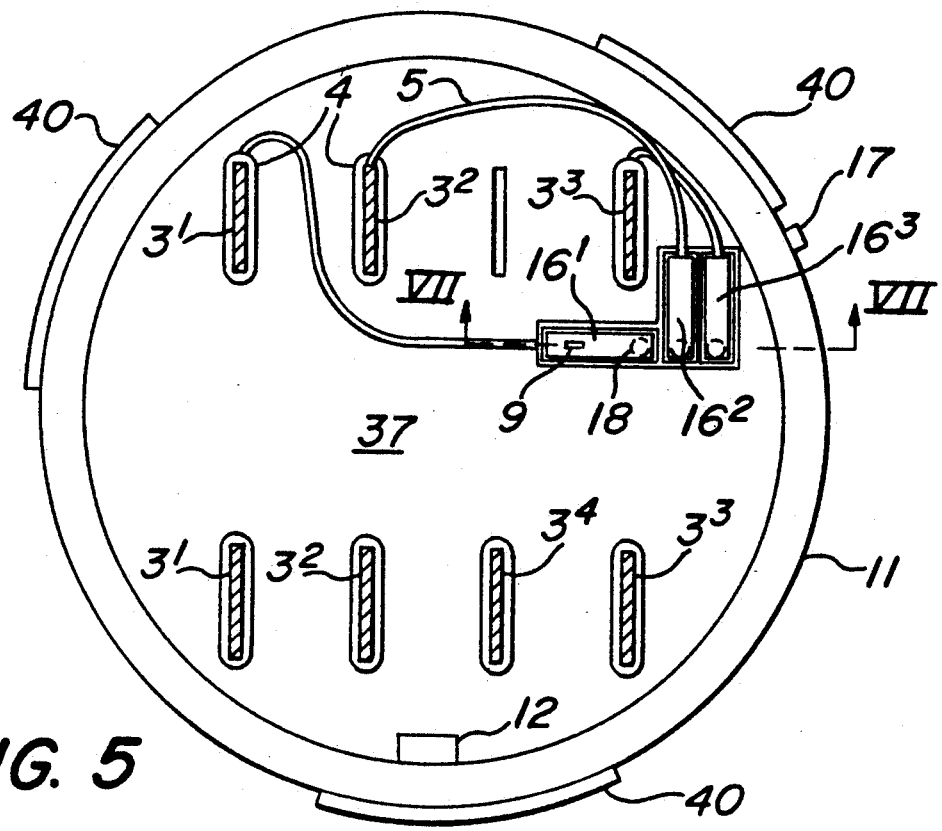
FIGS. 5 and 6 are views similar to FIGS. 2 and 3, showing the inboard and outboard sides, respectively, of the base portion of a meter according to the current invention.
Figure 6:
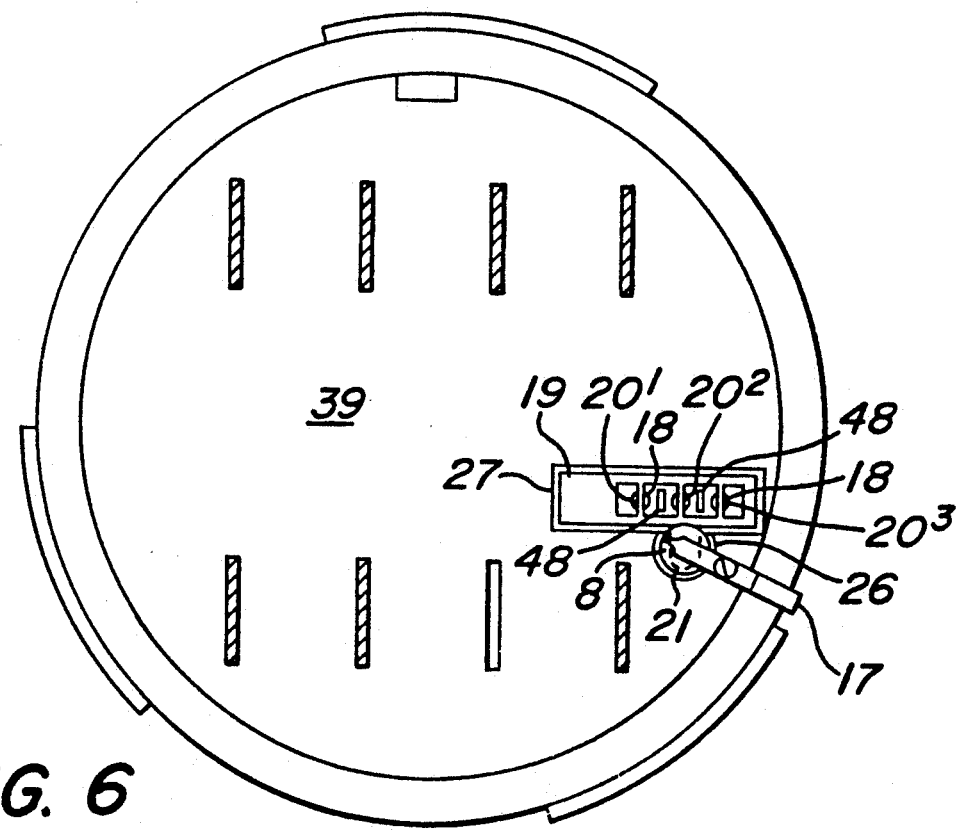

There is shown in FIGS. 5 and 6 the inboard and outboard sides 37 and 39, respectively, of the base portion 11 of a watthour meter, such as the meter shown in FIG. 1, embodying the surge protector according to the current invention. As previously discussed, blade pairs $3^1$, $3^2$ and $3^3$ connect the first, second and third phases of a load circuit to a metering element, such as the electronic register 34. Blade $3^4$ connects the ground wire of the load circuit to the metering element. As shown best in FIG. 7, the surge protector for all three phases is comprised of three first electrodes 16, three spark gaps 25, one second electrode 19, a single resistive block 8 and a single ground strap 17.

Figure 7:
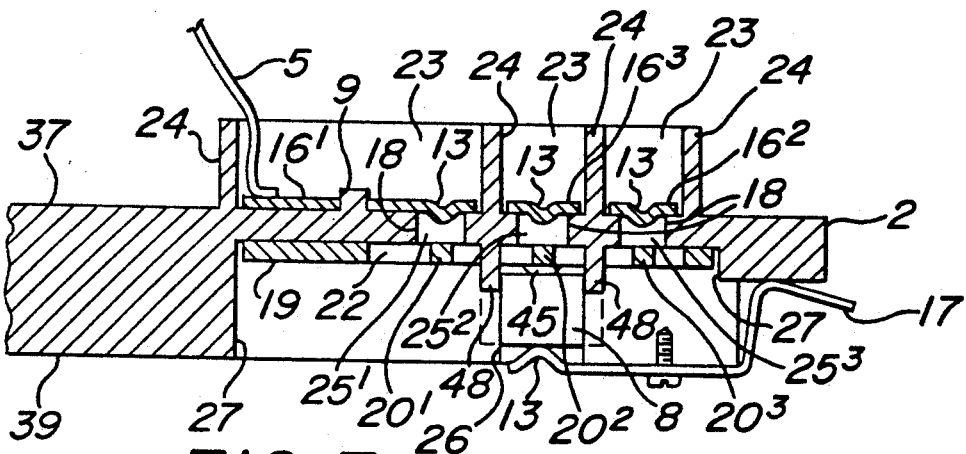
FIG. 7 is a cross-section through line VII—VII shown in FIG. 5.

In the embodiment shown in FIG. 5, the three electrodes 16 are connected, via conductors 5, to washers 4 which are in turn connected to blade pairs $3^1$, $3^2$ and $3^3$ so that one electrode 16 is connected to each phase. However, it should be appreciated that voltage connections can also be made to dedicated terminals in the meter base. As shown in FIG. 7, each electrode 16 is comprised of a strip of metal secured to the inboard side 37 of the meter base 11 by a post 9. A dimple 13 is formed in the end of each electrode 16, each dimple being disposed adjacent one end of three holes 18 formed in the inboard side 37 of the meter base 11. The second electrode 19 is disposed in a recess 27 formed in the outboard side 39 of the meter base 11 adjacent the other end of each of the holes 18.

Figure 8:
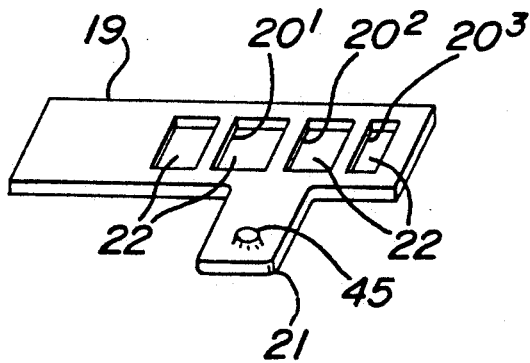
FIG. 8 is an isometric view of the electrode bar shown in FIG. 6.

As shown best in FIG. 8, the electrode 19 is comprised of a metal bar in which four windows 22 are cut so as to form three electrode tips 20. As shown in FIGS. 6 and 7, the electrode bar 19 is located so that one electrode tip 20 is disposed at the end of each hole 18. Thus, as shown in FIG. 7, the spark gap 25, is formed between each dimple 13 of the first electrodes 16 and each tip 20 of the second electrode 19. In the preferred embodiment, the width of the gap 25 is approximately 0.071 inches.

As shown in FIGS. 6 and 7, a resistive block 8 is mounted in a hole 26 on the outboard side 39 of the meter base 11. In the preferred embodiment, the resistive block is formed from carbon and has a resistance of at least 500 ohms. A dimple 13 in the ground strap 17, secured to he outboard side 39 of the meter base 11 by a screw 46, presses the resistive block 8 against a tab 21, shown best in FIG. 8, which extends from one edge of the electrode 19. Thus, the resistive block 8 is in surface contact with both the electrode 19 and the ground strap 17. The end of the ground strap 17 opposite the dimple 13 extends from the meter base so as to contact the socket 29 when the meter body is attached thereto.

Figure 9:
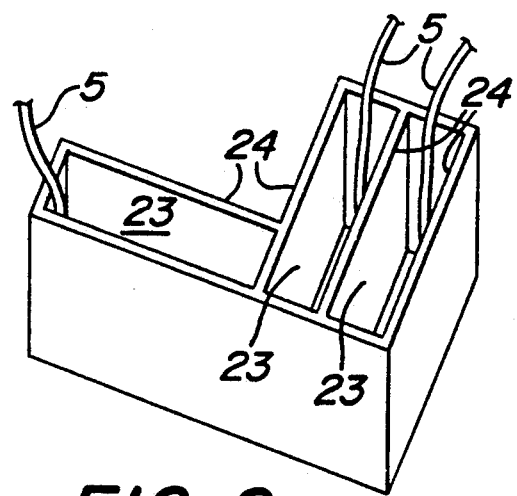
FIG. 9 is an isometric view of the electrode cavities shown FIG. 5.

Since, according to the current invention, the electrodes 16 are in close proximity, there is a danger of arcing between two of the electrodes 16. Thus, according to an important aspect of the current invention, a plurality of walls 24 extend upward from the inboard side 37 of the meter base 11. As shown in FIG. 9, the walls 24 create cavities 23 which individually surround each of the three electrodes 16 and holes 18, thereby preventing arcing between the electrodes 16. In the preferred embodiment, the walls 24 are at least 0.35 inch high.

Since the spark gaps 25 are in close proximity, there is also a danger that ionized gases from one spark gap will migrate into an adjacent spark gap, thereby lowering its resistance to arcing and causing unnecessary grounding in a phase other than the one experiencing the surge. Thus, according to another important aspect of the current invention, two walls 48 project downward from the outboard side 39 of the meter base 11 and extend through the windows 22 in the electrode 19, as shown in FIGS. 6 and 7. One wall 48 is disposed between spark gaps $25^1$ and $25^2$ and the other wall is disposed between spark gaps $25^2$ and $25^3$. In the preferred embodiment, the walls 48 are at least 0.2 inch high and serve to prevent the communication of gases between the spark gaps 25.

As is well known, current flow creates a magnetic field that tends to repulse the ionized gases produced by the sparking in the spark gaps 25. Such magnetic fields are strongest if the current both to and from the spark gap 25 travels in parallel paths. Thus, according to the current invention, the electrodes $16^2$ and $16^3$ and the tips 20 of electrode 19 are oriented so that the direction of the current flow through electrodes $16^2$ and $16^3$ to the spark gaps $25^2$ and $25^3$ is parallel to the direction of the current flow from these spark gaps to the resistive block 8 through the electrode tips 20 and tab 21. As a result, relatively strong magnetic fields are generated with respect to spark gaps $25^2$ and $25^3$ that tend to drive the ionized gases out of the gaps.

To protect the meter base 11 from damage, the arcing must occur through the center of the gap 25, not in a secondary path along the side of the phenolic of the meter base. This is ensured by the presence of the dimple 13 in each electrode 16 and the relatively thin width of each of the electrode bar tips 20 which locate the minimum spark gap width within the center of the hole. Also, as shown in FIG. 8, a dimple 45 formed on the electrode bar tab 21 further ensures the correct locating of the arcing current flow path.

Thus, the conductors 5, electrodes 16, spark gaps 25, electrode 19 and resistive block 8 are capable of creating an electrical flow path from the blades 3 to the single ground strap 17, and thence to the socket 29 and ground. This permits current to flow from any one of the phases of the load circuit to ground if there is a surge large enough to cause arcing in the spark gap 25 associated with that phase. Note that such surge protection for all three phases of a three phase meter is achieved using only a single resistive block 8 and ground strap 17, thereby considerably reducing the number of components and the labor required to install the meter. Moreover, since the resistive block 8 is mounted on the outboard side 39 of the meter base 11, the resistive block can be replaced by merely removing the ground strap 17, the meter cover 41 need not be removed, thereby reducing the labor necessary to maintain the meter.

Although the invention has been described with reference to a self contained three phase watthour meter having its own internal current and voltage transducers, it should be appreciated that the invention is equally applicable to so called "transformer rated" meters in which the current and voltage from the load circuit have already been stepped down prior to the connection to the socket. The invention is also applicable to two phase watthour meters as well as single phase watthour meters supplied with current from two phases. Moreover, it will be apparent to those skilled in the art that the invention is also applicable to multi-phase electronic apparatus other than watthour meters which incorporate devices for electronically performing predetermined functions other than metering of electrical usage. Accordingly, the present invention may be embodied in other specific forms without departing from the spirit or essential attributes thereof and, accordingly, reference should be made to the appended claims, rather than to the foregoing specification, as indicating the scope of the invention.

What is claimed:

1. A watthour meter, comprising:
a) a socket in electrical contact with ground; and
b) a meter body having:
  (i) a metering element for measuring power in a three phase electrical circuit;
  (ii) first, second and third conductors for connecting said first, second and third phases of said circuit to said metering element; and
  (iii) a surge protector having means for protecting said metering element from transient surges in each of said phases connected thereto, said means for protecting from transient surges having: (A) only one grounding strap for making grounding contact with said socket, (B) first, second and third electrodes in electrical contact with said first, second and third phases, respectively, of said circuit, (C) a fourth electrode electrically connected to said grounding strap, and (D) first, second and third spark gaps formed between said first, second and third electrodes, respectively, and said fourth electrode.

2. A watthour meter, comprising;
a) a socket in electrical contact with ground; and
b) a meter body having:
  (i) a metering element for measuring power in a three phase electrical circuit;
  (ii) first, second and third conductors for connecting said first, second and third phases of said circuit to said metering element; and
  (iii) a surge protector having means for protecting said metering element from transient surges in each of said phases connected thereto, said surge protector having only one grounding strap for making grounding contact with said socket, said means for protecting from transient surges including (A) first, second and third electrodes in electrical contact with said first, second and third phases of said circuit, respectively, and (B) an electrical path formed between each of said first, second and third electrodes and said grounding strap in response to a surge in any of said first, second and third phases, respectively, said electrical path formed by a fourth electrode electrically connected to said grounding strap and having integrally formed first, second and third electrode tips, said first, second and third electrode tips forming first, second and third spark gaps between said first, second and third electrodes, respectively, and said fourth electrode.

3. The meter according to claim 2, wherein said meter body further comprises a base portion, said base forming first, second and third holes surrounding said first, second and third spark gaps, respectively.

4. The meter according to claim 3, wherein said first, second and third electrode tips are disposed adjacent said first, second and third holes, respectively.

5. The meter according to claim 1, wherein said meter body further comprises means for retarding the communication of gas among said first, second and third electrodes.

6. The meter according to claim 1, wherein said first, second and third electrodes are arranged proximate each other so as to enable said fourth electrode to span each of said first, second and third electrodes, and wherein first, second and third cavities are formed in said meter body surrounding said first, second and third electrodes, respectively, each of said cavities being disposed adjacent another one of said cavities and separated therefrom by an intervening wall, whereby arcing between said first, second and third cavities is prevented.

7. The meter according to claim 6, wherein:
said meter body further comprises means for retarding the communication of gas among said first, second and third spark gaps.

8. The meter according to claim 7, wherein said gas communication retarding means comprises said walls separating said cavities extending so as to be disposed between said first and second and between second and third spark gaps, respectively.

9. The meter according to claim 1, wherein said meter body further comprises means for preventing arcing between said first, second and third electrodes.

10. The metering according to claim 9, wherein said arc preventing means comprises a plurality of walls, said walls forming first, second and third cavities surrounding said first, second and third electrodes, respectively.

11. A watthour meter, comprising:
a) a socket in electrical contact with ground; and
b) a meter body having:
   (i) a metering element for measuring power in a three phase electrical circuit;
   (ii) first, second and third conductors for connecting said first, second and third phases of said circuit to said metering element; and
   (iii) a surge protector having means for protecting said metering element from transient surges in each of said phases connected thereto, said surge protector having: (A) only one grounding strap for making grounding contact with said socket, (B) first, second and third electrodes in electrical contact with said first, second and third phases of said circuit, and (C) means for creating an electrical path between each of said first, second and third electrodes and said grounding strap in response to a surge in any of said first, second and third phases, respectively, said electrical path creating means including a spark gap and means for increasing the resistance of said electrical path created thereby, said resistance increasing means consisting of a single resistive block.

12. The meter according to claim 11, wherein said resistive block is in surface contact with said grounding strap.

13. The meter according to claim 11, wherein said electrical path creating means further comprises a fourth electrode, said first, second and third spark gasp formed between said first, second and third electrodes, respectively, and said fourth electrode.

14. A watthour meter, comprising:
a) a socket in electrical contact with ground; and
b) a meter body having:
   (i) a metering element for measuring power in a three phase electrical circuit;
   (ii) first, second and third conductors for connecting said first, second and third phases of said circuit to said metering element; and
   (iii) a surge protector having means for protecting said metering element from transient surges in each of said phases connected thereto, said surge protector having only one grounding strap for making grounding contact with said socket;
   (iv) said means for protecting against transient surges including (A) first, second and third electrodes in electrical contact with said first, second and third phases of said circuit, and (B) means for creating an electrical path between each of said first, second and third electrodes and said grounding strap in response to a surge in any of said first, second and third phases, respectively;
   (v) said electrical path creating means including (A) first, second and third spark gaps for said first, second and third phases, respectively, (B) a fourth electrode, said first, second and third spark gaps formed between said first, second and third electrodes, respectively, and said fourth electrode, and (C) a resistive block disposed between and in surface contact with said grounding strap and said fourth electrode.

15. A multi-phase electrical apparatus, comprising:
a) means for electronically performing a predetermined function;
b) first and second means for connecting first and second phases, respectively, of an electrical circuit to said electronic function means; and
c) a surge protector for protecting said electronic function means from transient surges in each of said phases, said surge protector having:
   (i) first, second and third electrodes, said first and second electrodes connected to said first and second phases by said first and second connecting means, respectively;
   (ii) first and second spark gaps formed between said first and second electrodes, respectively, and said third electrode, said first and second electrodes being arranged proximate each other so as to enable said third electrode to span each of said first and second electrodes;
   (iii) means for connecting said third electrode to ground; and
   (iv) inhibiting means for inhibiting arcing between said first and second electrodes and for inhibiting gas communication between said first and second spark gaps, said inhibiting means having a plurality of first walls forming firs and second cavities surrounding said first and second electrodes, respectively, said first and second cavities being disposed adjacent one another and separated by one of said first walls.

16. The electrical apparatus according to claim 15, wherein said means for connecting said third electrode to ground comprises:
a) a conductor connected to ground; and
b) a resistor disposed between and in contact with said third electrode and said conductor.

17. The electrical apparatus according to claim 15, wherein each of said first walls is at least 0.35 inch high.

18. The electrical apparatus according to claim 17, further comprising a base portion for supporting said electronic function means, said first walls integrally formed in said base portion.

19. The electrical apparatus according to claim 18, wherein said inhibiting means further comprises a second wall, said second wall disposed between said first and second spark gaps.

20. The electrical apparatus according to claim 15, further comprising:
a) a base portion having inboard and outboard sides;
b) a resistor disposed adjacent said third electrode; and
c) a cover attached to said base portion, said cover enclosing said inboard side of said base portion, and wherein said resistor is mounted on said outboard site.

21. An electrical apparatus, comprising:
a) means for electronically performing a predetermined function;
b) first and second means for connecting first and second phases, respectively of an electrical circuit to said electronic function means; and
c) a surge protector for protecting said electronic function means having:
   (i) first, second and third electrodes, said first and second electrodes connected to said first and second connecting means, respectively; and
   (ii) first and second spark gaps formed between said first and second electrodes, respectively, and said third electrode, said first, second and third electrodes being oriented with respect to each other so that current flowing to said first and second spark gaps through said first and second electrodes, respectively, travels in a direction substantially parallel to current flowing form said first and second spark gaps through said third electrode, whereby magnetic fields are created in said first and second spark gaps that the dot repulse gases formed by ionizing air in said spark gaps.

22. A watthour meter comprising:
a) a metering element;
b) a base portion having means for connecting to first and second lines of an electrical circuit;
c) a cover enclosing said metering element and attached to said base portion; and
d) a surge protector having means for protecting said metering element form transient surges in each of said lines, said surge protector having:
   (i) first and second electrodes electrically connected to said first and second lines; respectively;
   (ii) means for placing said surge protector in electrical contact with ground; and
   (iii) a third electrode electrically connected to said grounding means, said third electrode having first and second integrally formed electrode tips, said first and second electrode and said first and second electrode tips of said third electrode forming first and second spark gaps therebetween.

23. The meter according to claim 22, wherein said surge protecting means further comprises a resistor disposed between said third electrode and said grounding means.

24. The meter according to claim 23, wherein said base portion has an inboard side enclosed by said cover and an outboard side opposite said inboard side, and wherein said resistor is mounted on said outboard side, whereby said resistor is capable of being removed without separating said cover from said base portion.

* * * * *

UNITED STATES PATENT AND TRADEMARK OFFICE
CERTIFICATE OF CORRECTION

PATENT NO. : 5,282,108
DATED : January 25, 1994
INVENTOR(S) : Mark L. Munday and Rodney C. Hemminger It is certified that error appears in the above-identified patent and that said Letters Patent is hereby corrected as shown below:

```
Column 4, line 37, delete the word "he" and insert therefor
--the--;
Column 7, line 49, delete the word "gasp" and insert therefor
--gaps--;
Column 8, line 39, delete the word "firs" and insert therefor
--first--;
Column 9, line 21, delete the word "form" and insert therefor
--from--;
Column 9, line 26, delete the words "the dot" and insert
therefor --tend to--;
Column 10, line 15, delete the word "electrode" and insert
therefor --electrodes--.
```

Signed and Sealed this

Twelfth Day of July, 1994

Attest:

BRUCE LEHMAN

Attesting Officer  Commissioner of Patents and Trademarks